US007986750B2

(12) United States Patent
Hwang et al.

(10) Patent No.: US 7,986,750 B2
(45) Date of Patent: Jul. 26, 2011

(54) APPARATUS AND METHOD FOR REMOVING INTERFERENCE IN TRANSMITTING END OF MULTI-ANTENNA SYSTEM

(75) Inventors: In-Soo Hwang, Yongin-si (KR); Cheol-Woo You, Seoul (KR); Yung-Soo Kim, Seongnam-si (KR); Dong-Ho Kim, Seoul (KR); Vahid Tarokh, Cambridge, MA (US)

(73) Assignee: Samsung Electronics Co., LLP, Suwon-si (KR)

( * ) Notice: Subject to any disclaimer, the term of this patent is extended or adjusted under 35 U.S.C. 154(b) by 939 days.

(21) Appl. No.: 11/776,631

(22) Filed: Jul. 12, 2007

(65) Prior Publication Data

US 2008/0018535 A1 Jan. 24, 2008

(30) Foreign Application Priority Data

Jul. 12, 2006 (KR) ........................ 10-2006-0065239

(51) Int. Cl.
*H03K 9/00* (2006.01)

(52) U.S. Cl. ........ 375/316; 375/269; 375/267; 375/146; 375/299

(58) Field of Classification Search .................. 342/368; 370/480, 210; 708/200, 607; 455/303, 500; 375/269, 316, 259, 299, 267, 347, 296, 146, 375/148, 341, 349, 144
See application file for complete search history.

(56) References Cited

U.S. PATENT DOCUMENTS

| | | | | |
|---|---|---|---|---|
| 6,178,196 | B1 * | 1/2001 | Naguib et al. | 375/148 |
| 7,477,695 | B2 * | 1/2009 | Takano | 375/261 |
| 7,602,855 | B2 * | 10/2009 | Koo et al. | 375/267 |
| 7,609,771 | B2 * | 10/2009 | Lo | 375/259 |
| 7,653,142 | B2 * | 1/2010 | Ketchum et al. | 375/267 |
| 2004/0224725 | A1 * | 11/2004 | Kim et al. | 455/561 |
| 2006/0234751 | A1 * | 10/2006 | Horng et al. | 455/522 |
| 2007/0232235 | A1 * | 10/2007 | Li et al. | 455/63.1 |
| 2008/0112504 | A1 * | 5/2008 | Jiang et al. | 375/296 |
| 2008/0317158 | A1 * | 12/2008 | Ketchum et al. | 375/267 |
| 2011/0026632 | A1 * | 2/2011 | Wight | 375/267 |

FOREIGN PATENT DOCUMENTS

| | | | |
|---|---|---|---|
| KR | 10-2005-0027186 | A | 3/2005 |
| KR | 10-2006-0068082 | A | 6/2006 |
| KR | 10-2006-0070059 | A | 6/2006 |

OTHER PUBLICATIONS

Precoding in the multiuser MIMO downlink based on subspace tracking techniques Yongle Wu; Jinfan Zhang; Shidong Zhou; Xibin Xu; Vehicular Technology Conference, 2005. VTC-2005-Fall. 2005 IEEE 62nd ; pp. 2382-2386).*

* cited by examiner

*Primary Examiner* — Shuwang Liu
*Assistant Examiner* — Helene Tayong
(74) *Attorney, Agent, or Firm* — Jefferson IP Law, LLP

(57) ABSTRACT

An apparatus and method for removing interference in a transmitting end of a multi-antenna system is provided. The method includes decomposing a channel matrix including channel coefficients for a plurality of terminals, calculating a value proportional to an interference signal for each of antennas, and calculating a sum of a transmission signal and the calculated value for each terminal and multiplying the calculated sum by the decomposed channel matrix. Accordingly, channel capacity can be improved by optimizing a data transfer rate and transmission power for each terminal.

23 Claims, 7 Drawing Sheets

APPARATUS AND METHOD FOR REMOVING INTERFERENCE IN TRANSMITTING END OF MULTI-ANTENNA SYSTEM

PRIORITY

This application claims the benefit under 35 U.S.C. §119 (a) to a Korean patent application filed on Jul. 12, 2006 in the Korean Intellectual Property Office and assigned Serial No. 2006-65239, the entire disclosure of which is hereby incorporated by reference.

BACKGROUND OF THE INVENTION

1. Field of the Invention

The present invention relates to a multi-antenna system. More particularly, the present invention relates to an apparatus and method for removing interference in a transmitting end of the multi-antenna system.

2. Description of the Related Art

A multi-user multi-antenna system has conventionally employed either a Zero-Forcing (ZF) scheme or a Minimum Mean Square Error (MMSE) scheme. In the ZF scheme, a signal transmitted from a transmitting end (i.e., Base Station (BS)) is multiplied by an inverse of a channel matrix so as to reduce interference caused by a different Mobile Station (MS) or a different antenna. In the MMSE scheme, signal transmission is achieved in consideration of a channel noise variation.

The ZF scheme and the MMSE scheme have advantages in that a transmitting end can be easily implemented, and an error rate is not significantly increased even when the amount of channel feedback information transmitted from MSs is not sufficient. In particular, several schemes are actively being discussed in many standardization organizations such as the 3rd Generation Partnership Project Long Term Evolution (3GPP LTE), wherein such schemes employ a structure in which, instead of feeding back entire channel information, each MS selects a suitable vector from a pre-defined codebook and feeds back a codebook index and Channel Quality Information (CQI), and a transmitting end then utilizes channel information received from each MS and thus performs a scheduling operation so that sum capacity can be maximized.

The ZF scheme and the MMSE scheme are based on linear pre-coding. On the other hand, some examples of schemes based on non-linear pre-coding include a Tomlinson-Harashima Precoding (THP) scheme in which Dirty Paper Coding (DPC) is applied to a one-dimensional vector and a Vector Perturbation (VP) scheme in which the DPC is applied to an $n^{th}$ dimensional vector. In such a non-linear pre-coding scheme, a receiving end (i.e., MS) sends accurate Channel State Information (CSI) or its equivalent to a transmitting end, and the transmitting end allows a transmission signal to be subject to a modulo operation so that a positive integer value is added to or subtracted from the transmission signal. Even when the receiving end does not know the positive integer value, the receiving end can estimate the signal through the same modulo operation as applied at the transmitting end. Accordingly, the transmitting end can optimize both a channel and a transmission signal. Hence, the non-linear precoding scheme has been researched as a promising technology in a Time Division Duplex (TDD) nomadic environment where feedback is frequently made to the transmitting end.

Meanwhile, the ZF scheme and the MMSE scheme have demerits as follows: performance deterioration and transmission power loss are inevitable; transmission power has to be constant for each MS or each antenna; each MS has to use only one antenna; or, in particular, discrepancy between sum capacity and ideal capacity becomes significant as Signal-to-Noise Ratio (SNR) increases.

Moreover, the DPC-based non-linear scheme has demerits as follows: a data transfer rate has to be constant for each MS; and each MS has to use only one antenna. Therefore, disadvantageously, Quality of Service (QoS) for each MS cannot be properly ensured.

Accordingly, there is a demand for a method in which performance can be maximized by optimizing a data transfer rate and transmission power for each MS in a multi-antenna system.

SUMMARY OF THE INVENTION

An aspect of the present invention is to address at least the above-mentioned problems and/or disadvantages and to provide at least the advantages described below. Accordingly, an aspect of the present invention is to provide an apparatus and method for removing interference in a transmitting end of a multi-antenna system.

Another aspect of the present invention also is to provide an apparatus and method for increasing sum capacity of a channel by optimizing a data transfer rate and transmission power for Mobile Stations (MSs) by decomposing a channel matrix of each MS, in a transmitting end of a multi-antenna system.

According to an aspect of the present invention, a method of removing interference in a transmitting end of a multi-antenna system is provided. The method includes decomposing a channel matrix having channel coefficients for a plurality of terminals, calculating a value proportional to an interference signal for each antenna, and calculating a sum of a transmission signal and the calculated value for each terminal, and multiplying the calculated sum by the decomposed channel matrix.

According to another aspect of the present invention, a method of removing interference in a multi-antenna system is provided. The method includes in a transmitting end, decomposing a channel matrix including channel coefficients for a plurality of terminals, calculating a value proportional to an interference signal, for each antenna, calculating a sum of a transmission signal and the calculated value for each terminal, and multiplying the calculated sum by the decomposed channel matrix, and in the terminal, detecting an original signal by removing an interference signal received from the transmitting end.

According to still another aspect of the present invention, an apparatus for removing interference in a transmitting end of a multi-antenna system is provided. The apparatus includes a channel decomposition unit for decomposing a channel matrix including channel coefficients for a plurality of terminals, and an encoder for calculating a value proportional to an interference signal for each antenna and for calculating a sum of a transmission signal and the calculated value for each terminal, and for multiplying the calculated sum by the decomposed channel matrix.

According to another aspect of the present invention, an apparatus for removing interference in a multi-antenna system is provided, The apparatus includes a transmitting end for decomposing a channel matrix including channel coefficients for a plurality of terminals, for calculating a value proportional to an interference signal for each of antennas, for calculating a sum of a transmission signal and the calculated value for each terminal, for multiplying the calculated sum by the decomposed channel matrix, and for transmitting the resultant signal to a corresponding terminal, and a plurality of terminals for detecting an original signal by removing an interference signal received from the transmitting end.

According to another aspect of the present invention, a signal detection method of a multi-antenna system is provided. The method includes nulling an upper-triangular element of a matrix multiplied by a signal of each of a plurality of terminals, detecting a signal for a first terminal, and removing interference of a second terminal by using the detected signal for the first terminal.

BRIEF DESCRIPTION OF THE DRAWINGS

The above and other objects, features and advantages of certain exemplary embodiments of the present invention will become more apparent from the following detailed description when taken in conjunction with the accompanying drawings in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of the exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Hereinafter, an apparatus and method for reducing interference in a transmitting end of a multi-antenna system will be described. Although a 2×2 Multi-Input Multi-Output (MIMO) system will be illustrated in the following descriptions as an example, the present invention is not limited thereto. Thus, the present invention may also apply to an M×N MIMO system.

Figure 1:
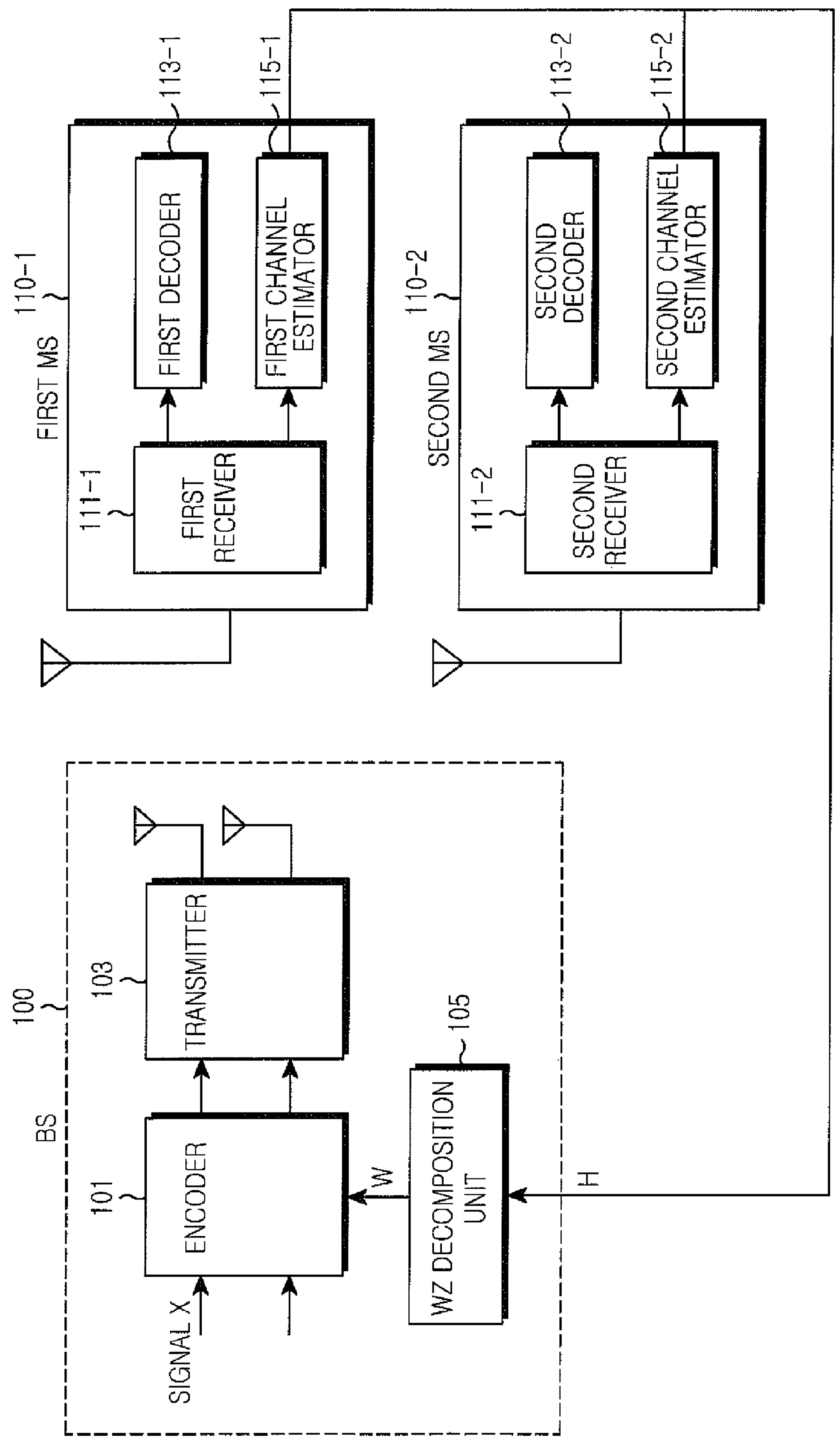
FIG. 1 is a block diagram illustrating a configuration of a multi-antenna system according to an exemplary embodiment of the present invention.

FIG. 1 is a block diagram illustrating a configuration of a multi-antenna system according to an exemplary embodiment of the present invention. It will be assumed that the multi-antenna system is constructed of a Base Station (BS) 100 having two transmitting antennas and two Mobile Stations (MSs) 110-1 and 110-2 each having a receiving antenna. Herein, the BS 100 is a transmitting end, and the MSs 110-1 and 110-2 are receiving ends. The BS 100 includes an encoder 101, a transmitter 103, and a WZ decomposition unit 105. The first and second MSs 110-1 and 110-2 respectively include first and second receivers 111-1 and 111-2, first and second decoders 113-1 and 113-2, and first and second channel estimators 115-1 and 115-2.

Referring to FIG. 1, for each of the MSs 110-1 and 110-2, by using channel information received from the WZ decomposition unit 105, the encoder 101 of the BS 100 determines whether the influence of an interference signal with respect to a channel is greater than a maximum threshold level. When a receiving antenna is not affected by the interference signal, the encoder 101 transmits a signal without alteration to the receiving antenna. Otherwise, the encoder 101 transmits the signal after the signal is combined with an integer value proportional to the interference signal by using a modulo operation. At a later time, the same modulo operation is performed in a receiving end (i.e., MS) so that the influence of the interference signal can be compensated for. In addition, the encoder 101 multiplies a signal to be transmitted to each receiving antenna by a matrix W input from the WZ decomposition unit 105, and outputs the resultant signal to the transmitter 103. The encoder 101 may be a pre-coder. In this case, the signal is input to the pre-coder after being modulated and encoded.

The WZ decomposition unit 105 generates a channel matrix H using channel information received from each of the MSs 110-1 and 110-2. Then, the WZ decomposition unit 105 decomposes the generated channel matrix H into a matrix W and a matrix Z, and outputs the decomposed matrix W to the encoder 101 together with the channel information for each of the MSs 110-1 and 110-2. The transmitter 103 transmits a signal transmitted from the encoder 101 to each of the MSs 110-1 and 110-2 via the respective transmitting antennas.

The first and second receivers 111-1 and 111-2 of the first and second MSs 110-1 and 110-2 receive signals from the BS 100 and then output the received signals to the first and second decoders 113-1 and 113-2 and the first and second channel estimators 115-1 and 115-2.

The first and second decoders 113-1 and 113-2 perform a modulo operation on the signals received from the first and second receivers 111-1 and 111-2 by using the same modulo operation as applied at the BS 100, and detect original signals from the received signals. The first and second channel estimators 115-1 and 115-2 estimate channels using the signals received from the first and second receivers 111-1 and 111-2, and transmit information on the estimated channels to the BS 100.

Figure 2:
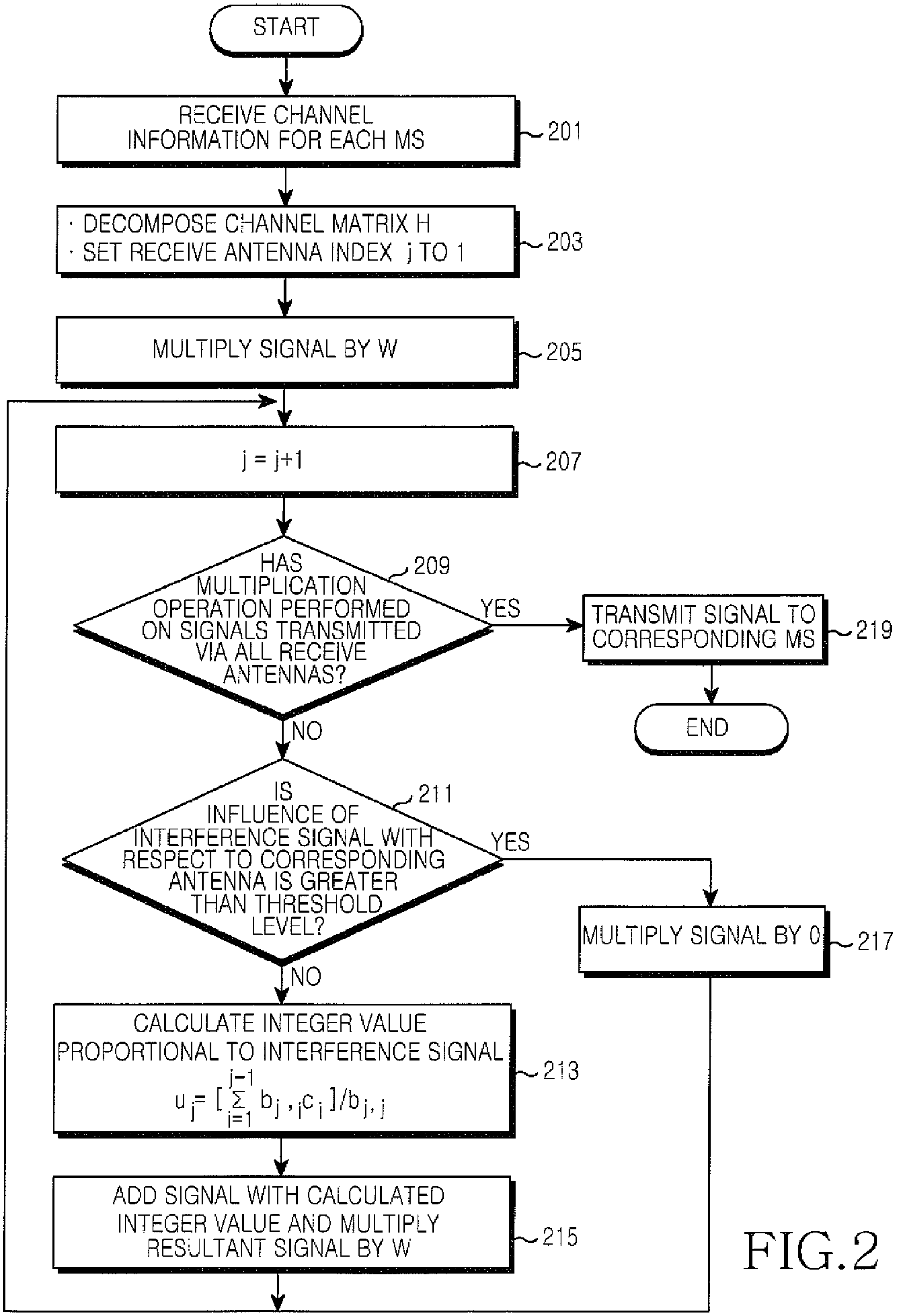
FIG. 2 is a flowchart illustrating a method of removing interference in a transmitting end of a multi-antenna system according to an exemplary embodiment of the present invention.

FIG. 2 is a flowchart illustrating a method of removing interference in a transmitting end (i.e., BS) of a multi-antenna system according to an exemplary embodiment of the present invention.

Referring to FIG. 2, in step 201, channel information is received from one or more MSs, and a channel matrix H is generated using the received channel information. For example, the BS has N transmitting antennas and the number of MSs is M. In this case, each MS estimates downlink channel information on the basis of a pilot signal transmitted from the BS via N transmitting antennas, and the estimated 1×N pieces of channel information are fed back to the BS. Then, the BS generates an M×N channel matrix H using the 1×N pieces of channel information received from the M MSs.

In step 203, the channel matrix H is decomposed into PZW using a Gram-Schimidt orthonormalization operation, and a receiving antenna index j is set to 1. W denotes an orthonormal matrix (i.e., an N×N unitary matrix) to be used as a pre-coding matrix. Z denotes an M×N lower-triangular matrix to be used to encode a signal while removing an interference of an MS. P denotes an M×M permutation matrix to be used to change antenna indices. An orthonormal basis is obtained from rows of the channel matrix H. Each row of W includes orthonormal basis elements. Z is a matrix including values corresponding to the orthonormal basis of the channel matrix H. When P is a unit matrix I, the M×N channel matrix H is decomposed into ZW.

The process of decomposing a 2×2 channel matrix H into ZW will now be described. First, the 2×2 channel matrix H can be expressed by Equation (1).

$$h_{2\times 2} = \begin{pmatrix} h_{11} & h_{12} \\ h_{21} & h_{22} \end{pmatrix} \tag{1}$$

Here, $h_{ji}$ denotes a channel coefficient (i.e., path intensity) between a receiving antenna of a $j^{th}$ MS and an $i^{th}$ transmitting antenna of a BS.

W is defined as a matrix in which a normalization condition (i.e., a channel gain (norm)=1)) is satisfied, and channel information used between MSs satisfies an orthogonal condition, $$\left(\text{i.e., } [\, h_{21} \;\; h_{22} \;\; * \,]\begin{bmatrix} h_{11} \\ h_{12} \end{bmatrix} = 0\right).$$

The channel matrix H is subject to a Gram-Schimidt orthonormalization operation in a row direction, and thus a first normalized vector $v_1$ is obtained as expressed by Equation (2).

$$v_1 = \left[ \frac{h_{11}}{\sqrt{|h_{11}|^2 + |h_{12}|^2}} \;\; \frac{h_{12}}{\sqrt{|h_{11}|^2 + |h_{12}|^2}} \right] \tag{2}$$

Here, a subspace $W_1$ is generated when the first normalized vector $v_1$ is spanned using a vector $u_2$. A projection matrix for the subspace $W_1$ can be expressed by Equation (3).

$$\begin{aligned} Proj_{w_1}(u_2) &= \langle u_2, v_1 \rangle \\ &= [h_{21} \;\; h_{22}] \left[ \frac{h_{11}^*}{\sqrt{|h_{11}|^2 + |h_{12}|^2}} \;\; \frac{h_{12}^*}{\sqrt{|h_{11}|^2 + |h_{12}|^2}} \right] \left[ \frac{h_{11}}{\sqrt{|h_{11}|^2 + |h_{12}|^2}} \;\; \frac{h_{12}}{\sqrt{|h_{11}|^2 + |h_{12}|^2}} \right] \\ &= \left( \frac{h_{21} h_{11}^* + h_{22} h_{12}^*}{\sqrt{|h_{11}|^2 + |h_{12}|^2}} \right) \left[ \frac{h_{11}}{\sqrt{|h_{11}|^2 + |h_{12}|^2}} \;\; \frac{h_{12}}{\sqrt{|h_{11}|^2 + |h_{12}|^2}} \right] \end{aligned} \tag{3}$$

A second normalized vector $v_2$ can be obtained using the projection matrix for the subspace $W_1$, as expressed by Equation (4).

$$\begin{aligned} v_2 &= \\ \frac{u_2 - Proj_{w_1} u_2}{\|u_2 - Proj_{w_1} u_2\|} &= \frac{\left[ \frac{h_{21}|h_{12}|^2 - h_{12}^* h_{11} h_{22}}{|h_{11}|^2 + |h_{12}|^2} \;\; \frac{h_{22}|h_{11}|^2 - h_{12} h_{11}^* h_{21}}{|h_{11}|^2 + |h_{12}|^2} \right]}{\|u_2 - Proj_{w_1} u_2\|} = \\ &\frac{(-h_{21} h_{12} + h_{22} h_{11}) \left[ \frac{-h_{12}^*}{|h_{11}|^2 + |h_{12}|^2} \;\; \frac{h_{11}^*}{|h_{11}|^2 + |h_{12}|^2} \right]}{\|u_2 - Proj_{w_1} u_2\|} \end{aligned} \tag{4}$$

After removing unnecessary elements through a phase shift operation and a normalization operation, W, including the vectors $v_1$ and $v_2$, can be expressed by Equation (5).

$$W_{2\times 2} = \begin{pmatrix} \frac{h_{11}}{\sqrt{|h_{11}|^2 + |h_{12}|^2}} & \frac{h_{12}}{\sqrt{|h_{11}|^2 + |h_{12}|^2}} \\ \frac{-h_{12}^*}{\sqrt{|h_{11}|^2 + |h_{12}|^2}} & \frac{h_{11}^*}{\sqrt{|h_{11}|^2 + |h_{12}|^2}} \end{pmatrix} \tag{5}$$

The channel matrix H can be decomposed into Z and W, as expressed by Equation (6).

$$Z_{2\times 2} = \begin{pmatrix} \sqrt{|h_{11}|^2 + |h_{12}|^2} & 0 \\ \frac{h_{21} h_{11}^* + h_{22} h_{12}^*}{\sqrt{|h_{11}|^2 + |h_{12}|^2}} & \frac{-h_{21} h_{11} + h_{22} h_{11}}{\sqrt{|h_{11}|^2 + |h_{12}|^2}} \end{pmatrix} \tag{6}$$

$$W_{2\times 2} = \begin{pmatrix} \frac{h_{11}}{\sqrt{|h_{11}|^2 + |h_{12}|^2}} & \frac{h_{12}}{\sqrt{|h_{11}|^2 + |h_{12}|^2}} \\ \frac{-h_{12}^*}{\sqrt{|h_{11}|^2 + |h_{12}|^2}} & \frac{h_{11}^*}{\sqrt{|h_{11}|^2 + |h_{12}|^2}} \end{pmatrix}$$

In step 205, a signal transmitted to a receiving antenna of a first MS is multiplied by the unitary matrix W. Since WW=I according to characteristics of a unitary matrix, the signal can be expressed by Equation (7).

$$y=HWx=(ZW)Wx=Z(WW)x=Zx \tag{7}$$

Here, y denotes a signal received by an MS, and x is an original signal. The signal y received by the first MS is combined with a noise signal n. Thus, the resultant signal becomes $Z_{x+n}$. The first MS may receive an original signal x without interference according to the calculation result of $Z_{x+n}$.

In step 207, the index j is incremented by 1. In step 209, it is determined whether signals transmitted via all receiving antennas have undergone a multiplication operation. If the signals have undergone the multiplication operation, in step 219, the signals are transmitted to corresponding MSs. Then, the procedure is ended.

If the multiplication operation is not done for the signals, in step 211, it is determined whether the influence of an interference signal with respect to an original signal is greater than a maximum threshold level for a corresponding antenna.

This can be determined using Equation (8).

$$\frac{\sum_{i=1}^{j-1} b_{j,i} c_i}{|b_{j,j}|} > T_j \tag{8}$$

Here, $b_{j,j}$ denotes an element of a matrix Z of an original signal for a $j^{th}$ receiving antenna. $c_i$ denotes a signal transmitted via an $i^{th}$ transmitting antenna of a BS.

$$\sum_{i=1}^{j-1} b_{j,i} c_i$$

denotes a sum of interference signals for the $j^{th}$ receiving antenna, that is, a sum of products of an interfering channel and a transmission signal. $T_j$ denotes a maximum threshold level.

If the influence of an interference signal with respect to an original signal is greater than the threshold level for a corresponding antenna in step 211, the procedure proceeds to step 217. In step 217, the transmission signal is multiplied by 0, and then the procedure returns back to step 207. This is because, when the interference signal significantly affects the original signal, errors are frequently produced even after decoding has been performed at a receiving end (i.e., MS).

If the influence of the interference signal with respect to the original signal is less than the threshold level in step 211, the procedure proceeds to step 213. In step 213, an integer value proportional to the interference signal is calculated.

The integer value $u_j$ proportional to the interference signal can be calculated using Equation (9).

$$u_j = \frac{\sum_{i=1}^{j-1} b_{j,i} c_i}{b_{j,j}} \tag{9}$$

In step 215, the calculated integer value $u_j$ is added to the transmission signal $c_j$, and the resultant transmission signal $v_j$ (i.e., $c_j+u_j$) is multiplied by W. Then, the procedure returns back to step 207.

The resultant transmission signal $v_j$ is mapped to one constellation point. It will be assumed that a set $A_j=\{a_1, a_2, \ldots, a_{qj}\}$ includes a total of qj constellation points for mapping the transmission signals, and a set $B_j$ is a union of a total of qj sets each of which does not have a common element. This can be related by Expression (10).

$$B_j = B_{1,j} \cup B_{2,j} \cup \ldots \cup B_{qj,j} \tag{10}$$

Figure 4:
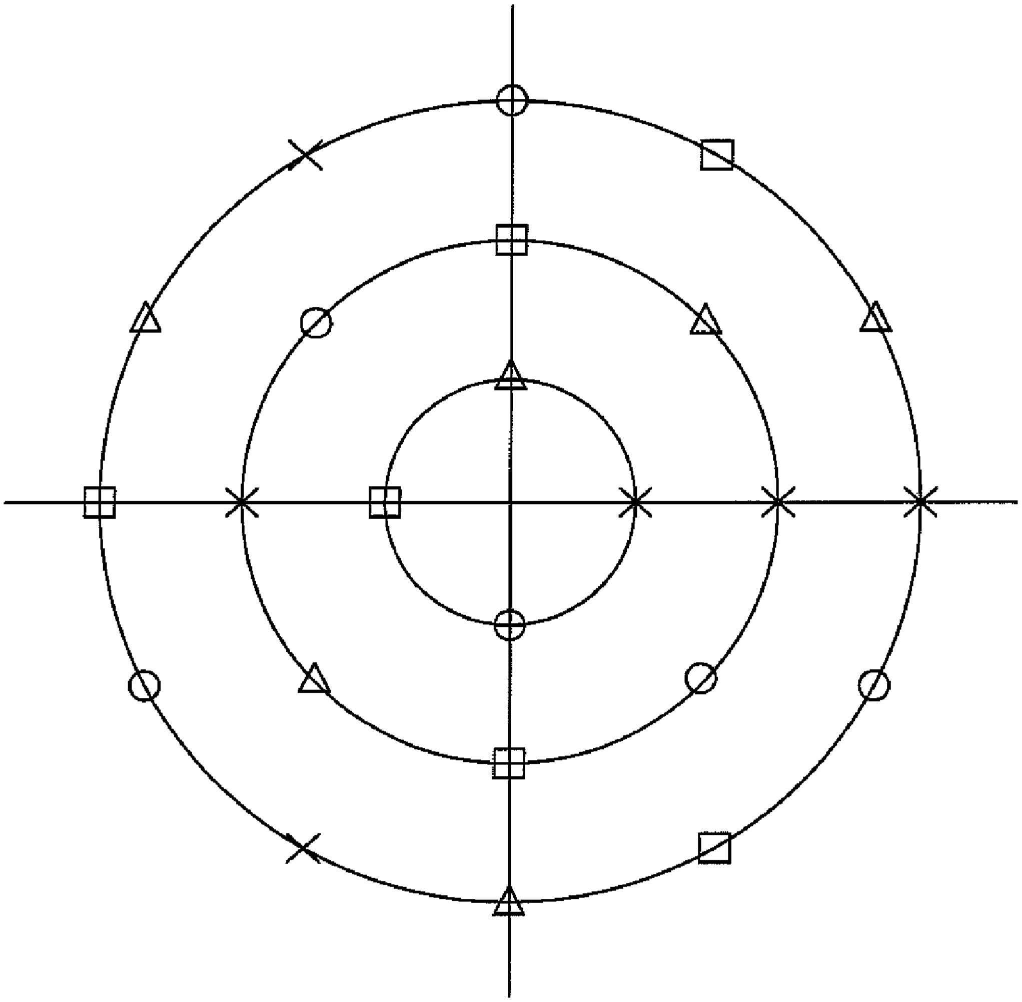
FIG. 4 is a view illustrating a Phase Shift Keying (PSK) constellation.
Figure 5:
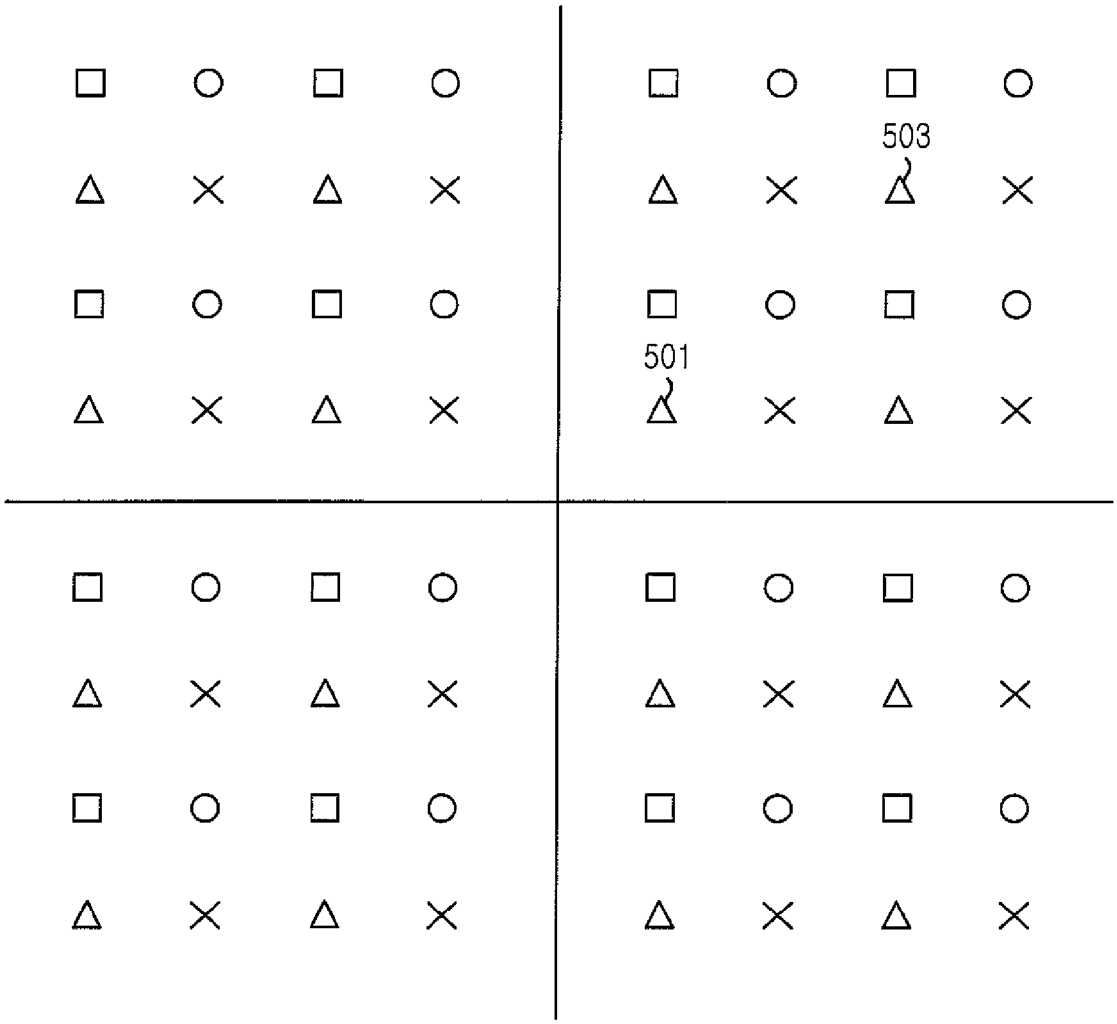
FIG. 5 is a view illustrating a Quadrature Amplitude Modulation (QAM) constellation.

Referring to FIG. 4 illustrating a Phase Shift Keying (PSK) constellation, the set $A_j$ may include symbols (□, Δ, x, ○) located at the center position. Other sets of symbols (□, Δ, x, ○) may be located extending up to the outermost circumference. The set $B_j$ may be a union of all sets of symbols (□, Δ, x, ○). The constellation in FIG. 4 is extended such that the symbols (□, Δ, x, ○) of the basic constellation set $A_j$ are symmetrically positioned spaced apart from one another by maximum distances. Referring to FIG. 5 illustrating a Quadrature Amplitude Modulation (QAM) constellation, the set $A_j$ may include symbols (□, Δ, x, ○) located near the origin of the coordinate. Other sets of symbols (□, Δ, x, ○) may be further located extending along any directions in the coordinate. The set $B_j$ may be a union of all sets of symbols (□, Δ, x, ○). The constellation of FIG. 5 is obtained by shifting the basic constellation set $A_j$ in the same pattern. Herein, the set $B_j$ can be indefinitely extended. A region where the basic constellation set $A_j$ is located is called a fundamental Voronoi region which is associated with channel coding and modulation points. The remaining area other than the fundamental Voronoi region is called a source coding region or a lattice region.

Figure 6A:
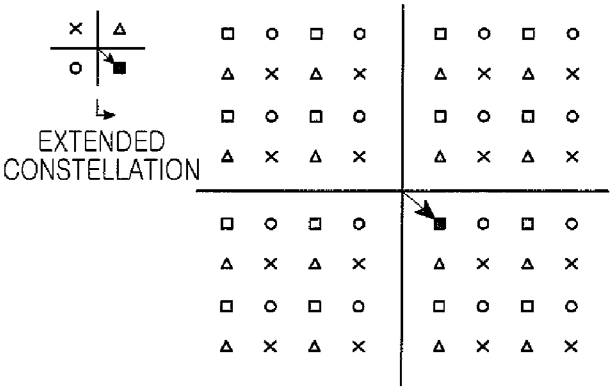
FIGS. 6A to 6E are views illustrating the constellation of FIG. 5.
Figure 6B:
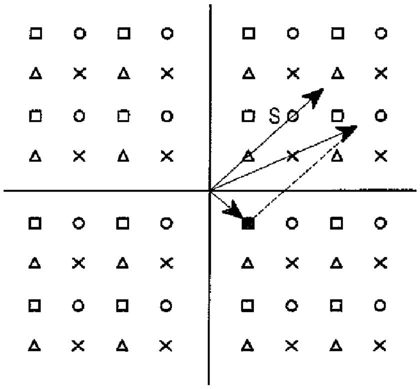
Figure 6C:
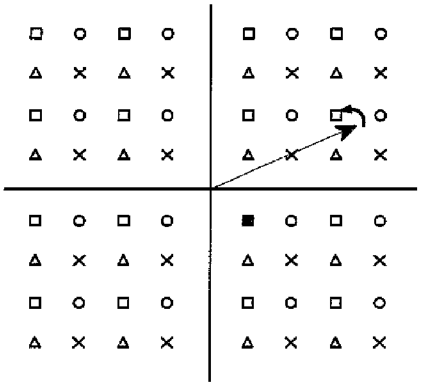
Figure 6D:
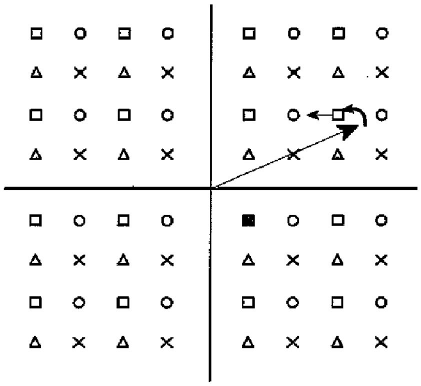
Figure 6E:
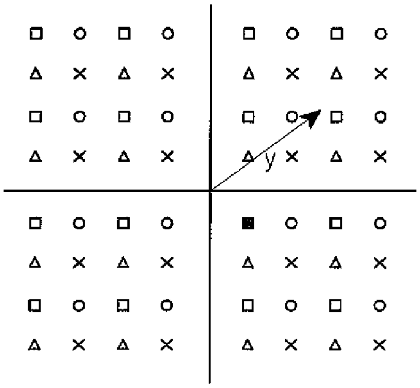

The constellation of FIG. 5 will now be described in detail with reference to FIGS. 6A to 6E. FIGS. 6A to 6E are views of a constellation where x denotes an original signal to be transmitted and s denotes an interference signal. First, the signal x is properly modulated. The signal x is marked as a filled square in the smaller coordinate located at the upper-left portion of FIG. 6A. The BS knows the interference signal s. The signal x is added with the interference signal s as shown in FIG. 6B. The resultant signal s+x is mapped to a nearest square as shown in FIG. 6C. The resultant signal s+x is added with a noise signal z while passing through a channel as shown in FIG. 6D. Thus, an MS receives a signal y (y=s+x+z) as shown in FIG. 6E. The signal y is decoded to the nearest square through a decoding process, and is then subject to a modulo operation. Thus, the MS can estimate the original signal x which is located near the origin in the coordinate.

When the BS transmits a signal $c_j$, which has been transmitted via a $j^{th}$ receiving antenna (see Equation (8)), to the MS, the MS knows that the signal $c_j$ will be added with an integer value $u_j$ proportional to an interference signal (see Equation (9)), thereby receiving a resultant signal $v_j$ (i.e., $c_j+u_j$). Thus, the BS searches for the location of the signal $v_j$ according to the flowchart of FIG. 2, where the signal $v_j$ is located on the constellation set $B_j$. Then, the BS transmits the signal $c_j$ to the MS via the j wherein the signal $c_j$ is obtained by subtracting $u_j$ from $v_j$. As such, the process of adding or subtracting a certain value to remove an interference signal from an original signal is called a modulo operation. A signal received by the MS includes an interference signal as expressed by Equation (11).

$$\begin{aligned} r_j &= (u_j + c_j) b_{j,j} + n_j \\ &= b_{j,1} c_1 + \ldots + b_{j,j-1} c_{j-1} + b_{j,j} c_j + n_j \\ &= b_{j,j} u_j + b_{j,j} c_j + n_j \\ &= b_{j,j} v_j + n_j \end{aligned} \tag{11}$$

Accordingly, a signal y received by an MS can be expressed by $Z_{x'+n}$.

When two MSs receive the signal y, Equation (12) is satisfied.

$$\begin{aligned} r_1 &= \sqrt{|h_{11}|^2 + |h_{12}|^2}\, c_1 + n_1 \\ r_2 &= \frac{h_{21} h_{11}^* + h_{22} h_{12}^*}{\sqrt{|h_{11}|^2 + |h_{12}|^2}} c_1 + \frac{-h_{21} h_{12} + h_{22} h_{11}}{\sqrt{|h_{11}|^2 + |h_{12}|^2}} c_2 + n_2 \end{aligned} \tag{12}$$

Here, $r_i$ denotes a signal received by an $i^{th}$ MS. Since the signal $r_2$ received by the second MS is multiplied by the lower-triangular matrix Z as described above, in order to obtain an original signal, the signal $r_2$ is subject to a modulo operation so that inferences of other MSs can be sequentially removed.

Referring to FIG. 5, by utilizing channel information received from a specific MS, the BS determines whether a receiving antenna of the MS is interfered with a channel. Thus, the BS knows that the interference may affect the location of the transmission signal on a constellation. For example, a transmission signal may be mapped to a point 501 before transmission, and the transmission signal may be demapped from a point 503 due to the interference. When the transmission signal is compensated for by the positional difference between the points 501 and 503 before transmission, the MS can receive an original signal from the BS. In this case, a modulo operation is performed for signal compensation while avoiding an increase in transmission power.

Figure 3:
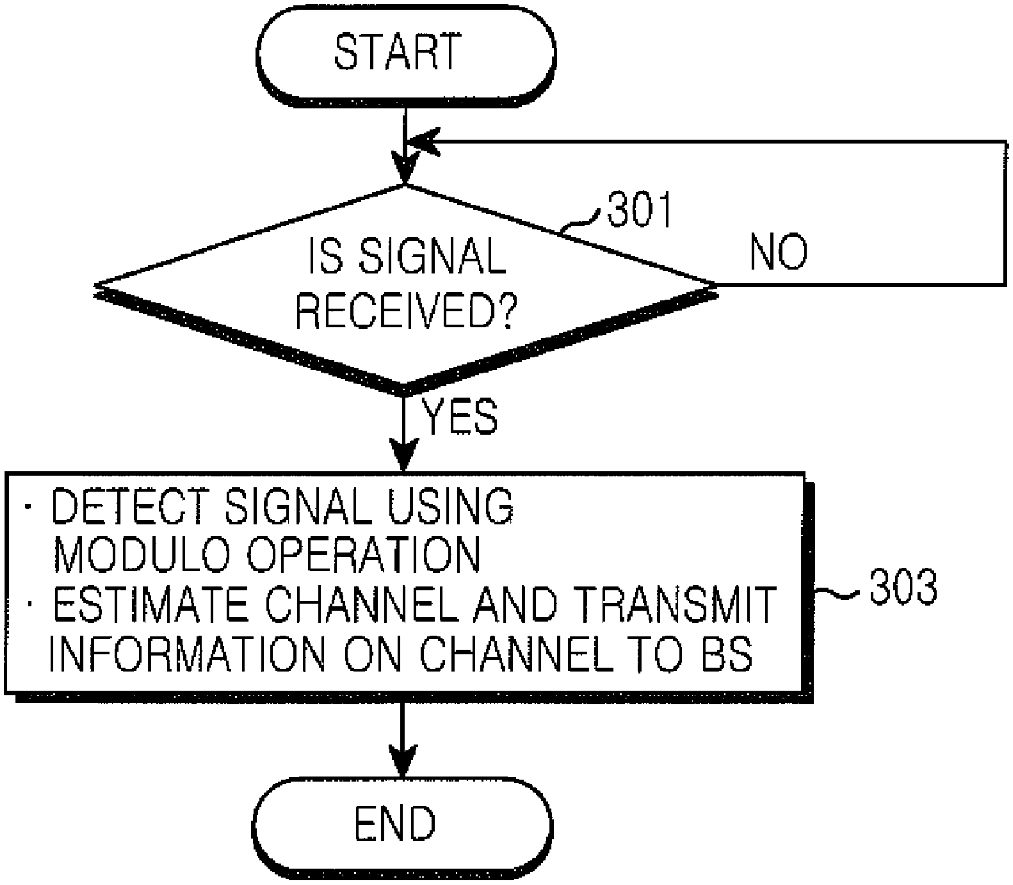
FIG. 3 is a flowchart illustrating a signal detection method performed in a terminal of a multi-antenna system according to an exemplary embodiment of the present invention.

FIG. 3 is a flowchart illustrating a signal detection method performed in a receiving end (i.e., MS) of a multi-antenna system according to an exemplary embodiment of the present invention.

Referring to FIG. 3, in step 301, it is determined whether a signal, transmitted from a BS to an MS, is received. In step 303, the signal is subject to a modulo operation to remove an interference signal, thereby detecting an original signal. Further, a downlink channel is estimated using the signal received by the MS, and information on the estimated channel is transmitted to the BS. Accordingly, the original signal is estimated and separated from the received signal along with a noise signal through the modulo operation, and thus exhaustive search can be avoided in all signal detection regions in the constellation.

The procedure is then ended.

Figure 7:
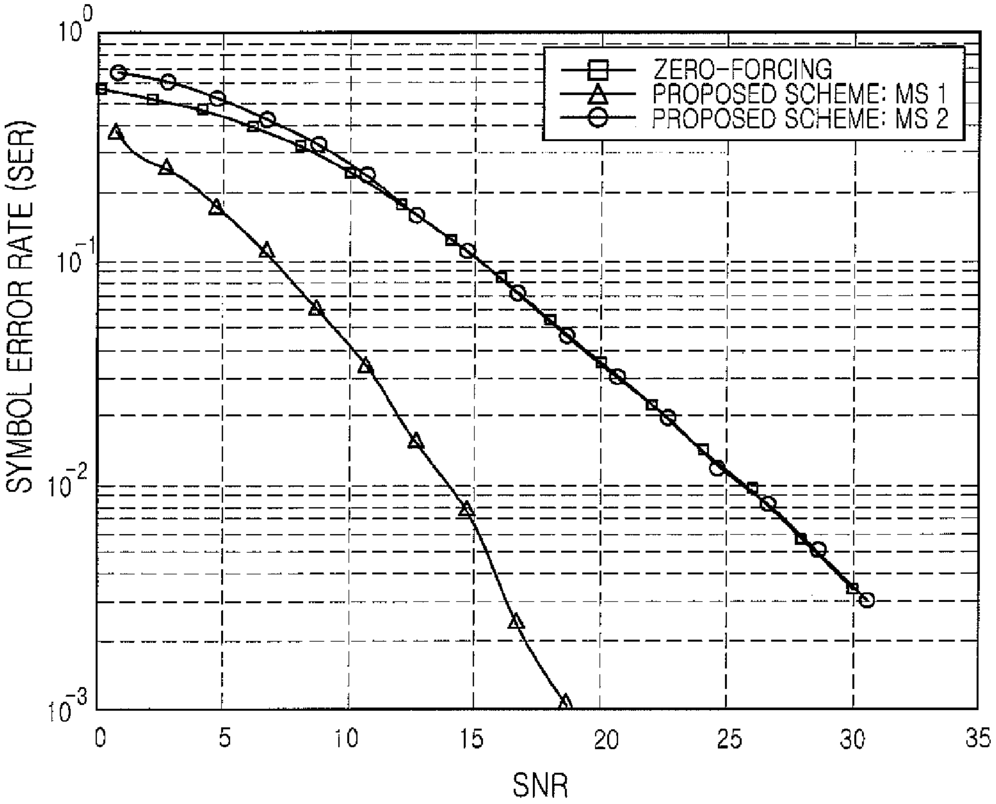
FIG. 7 is a graph illustrating performance of a 2×2 Multi-Input Multi-Output (MIMO) system of an exemplary embodiment of the present invention with respect to a conventional system.

FIG. 7 is a graph illustrating performance of a 2×2 MIMO system of an exemplary embodiment of the present invention with respect to a conventional system.

Referring to FIG. 7, an MS 1 illustrates a significantly improved performance as compared with a conventional Zero-Forcing (ZF) based scheme. An MS 2 illustrates the almost same performance as the conventional ZF based scheme. Herein, a data transfer rate of the MS 2 is twice as high as that of the ZF based scheme. The BS may assign a first transmitting antenna to an MS having a high error rate, and may assign a second transmitting antenna to an MS having a low data transfer rate.

According to an exemplary embodiment of the present invention, interference of a signal transmitted from each MS is removed through channel decomposition in a BS of a multi-antenna system. Hence, channel capacity can be improved by optimizing a data transfer rate and transmission power of each MS. In addition, each MS can have different performance using Dirty Paper Coding (DPC).

While the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the invention is defined not by the detailed description of the invention but by the appended claims, and all differences within the scope will be construed as being included in the present invention.

What is claimed is:

1. A method of reducing interference in a transmitting end of a multi-antenna system, the method comprising:

decomposing, at the transmitting end, a channel matrix having channel coefficients for a plurality of terminals;

calculating, at the transmitting end, a value proportional to an interference signal for a plurality of antennas;

calculating, at the transmitting end, a sum of a transmission signal and the calculated value for each antennas; and transmitting, at the transmitting end, a signal comprising the calculated sum of the transmission signal multiplied by the decomposed channel matrix, wherein the value proportional to the interference signal is obtained according to a ratio of a sum of interference signals for a corresponding antenna to an original signal for a corresponding antenna.

2. The method of claim 1, wherein the plurality of antennas, at the transmitting end, are at least 2.

3. The method of claim 1, wherein the channel matrix is decomposed through a Gram-Schimidt orthonormalization operation into at least one of an orthonormal unitary matrix to be used as a pre-coding matrix, a lower-triangular matrix to be used to encode the transmission signal while removing interference of a receiving end, and a permutation matrix used to change antenna indices.

4. The method of claim 3, wherein the decomposed orthonormal unitary matrix used as the pre-coding matrix is used when the multiplication operations are performed.

5. The method of claim 3, wherein the value proportional to the interference signal is obtained according to:

$$u_j = \frac{\sum_{i=1}^{j-1} b_{j,i} c_i}{b_{j,j}},$$

where $b_{j,j}$ denotes an element of a lower-triangular matrix of an original signal for a $j^{th}$ receiving antenna, $c_i$ denotes a signal transmitted via an $i^{th}$ transmitting antenna of the transmitting end, and $$\sum_{i=1}^{j-1} b_{j,i} c_i$$

denotes a sum of interference signals for the $j^{th}$ receiving antenna, that is, a sum of products of interfering channels and transmission signals.

6. The method of claim 3, wherein each row of the orthonormal unitary matrix comprises orthonormal basis elements obtained from rows of the channel matrix and satisfies normalization and orthogonality conditions, and the lower-triangular matrix comprises values corresponding to the orthonormal basis elements of the channel matrix.

7. The method of claim 1, further comprising mapping the signal that has undergone the multiplication operation to a constellation point and transmitting it to a corresponding terminal.

8. The method of claim 7, further comprising extending the constellation by shifting a basic constellation set in the same pattern.

9. The method of claim 7, further comprising extending the constellation so that the same type symbols of the basic constellation set are symmetrically positioned spaced apart from one another by a maximum distance.

10. The method of claim 8, further comprising:

subtracting the calculated value from one point of the extended constellation in order to satisfy transmission power; and mapping the signal that has undergone the multiplication operation to the point of the extended constellation.

11. The method of claim 1, further comprising multiplying the transmission signal by 0 when an influence of the interference signal is greater than a threshold level.

12. An apparatus for reducing interference in a transmitting end of a multi-antenna system, the apparatus comprising:

an A/D converter for converting the analog signals into digital signals;

a processor for processing the digital signals through a compression algorithm and for generating a stream of compressed signals;

a channel decomposition unit for decomposing, at the transmitting end, a channel matrix having channel coefficients for a plurality of terminals; and an encoder for calculating, at the transmitting end, a value proportional to an interference signal for a plurality of antennas, for calculating a sum of the compressed signal and the calculated value for each antennas, and for transmitting a transmission signal comprising the calculated sum of the compressed signal multiplied by the decomposed channel matrix, wherein the value proportional to the interference signal is obtained according to a ratio of a sum of interference signals for a corresponding antenna to an original signal for a corresponding antenna.

13. The apparatus of claim 12, wherein the encoder multiplies the transmission signal by 0 when an influence of the interference signal is greater than a threshold level.

14. The apparatus of claim 12, further comprising a transmitter for mapping the signal that has undergone the multiplication operation to a constellation point and for transmitting it to a corresponding terminal.

15. The apparatus of claim 14, wherein the constellation is extended by shifting a basic constellation set in the same pattern.

16. The apparatus of claim 14, wherein the constellation is extended so that the same type symbols of the basic constellation set are symmetrically positioned spaced apart from one another by a maximum distance.

17. The apparatus of claim 15, wherein the transmitter subtracts the calculated value from one point of the extended constellation in order to satisfy transmission power, and maps the signal that has undergone the multiplication operation to the point of the extended constellation.

18. The apparatus of claim 12, wherein the channel matrix is decomposed through a Gram-Schimidt orthonormalization operation into at least one of an orthonormal unitary matrix to be used as a pre-coding matrix, a lower-triangular matrix to be used to encode the transmission signal while removing interference of a receiving end, and a permutation matrix used to change antenna indices.

19. The apparatus of claim 18, wherein the decomposed orthonormal unitary matrix used as the pre-coding matrix is used when the multiplication operations are performed.

20. The apparatus of claim 18, wherein the value proportional to the interference signal is obtained according to:

$$u_j = \frac{\sum_{i=1}^{j-1} b_{j,i} c_i}{b_{j,j}},$$

where $b_{j,j}$ denotes an element of a lower-triangular matrix of an original signal for a $j^{th}$ receiving antenna, $c_i$ denotes a signal transmitted via an $i^{th}$ transmitting antenna of the transmitting end, and $$\sum_{i=1}^{j-1} b_{j,i} c_i$$

denotes a sum of interference signals for the $j^{th}$ receiving antenna, that is, a sum of products of interfering channels and transmission signals.

21. The apparatus of claim 18, wherein each row of the orthonormal unitary matrix comprises orthonormal basis elements obtained from rows of the channel matrix and satisfies normalization and orthogonality conditions, and the lower-triangular matrix comprises values corresponding to the orthonormal basis elements of the channel matrix.

22. A signal detection method of a multi-antenna system, the method comprising:

nulling, by a transmitting end, an upper-triangular element of a matrix multiplied by a signal of each of a plurality of terminals;

detecting, by a terminal, the signal for a first terminal; and removing, by the terminal, interference of a second terminal by using the detected signal for the first terminal, wherein the transmitting end decomposes a channel matrix having channel coefficients for a plurality of terminals, calculates a value proportional to an interference signal for a plurality of antennas, calculates a sum of a transmission signal and the calculated value for each antennas, and transmits a signal comprising the calculated sum of the transmission signal multiplied by the decomposed channel matrix, and wherein the value proportional to the interference signal is obtained according to a ratio of a sum of interference signals for a corresponding antenna to an original signal for a corresponding antenna.

23. The signal detection method of claim 22, further comprising detecting the signal for a $K^{th}$ terminal by sequentially removing interferences of the first terminal to a $(K+1)^{th}$ terminal in the same manner.

* * * * *